United States Patent [19]

Hada et al.

[11] Patent Number: 4,555,641
[45] Date of Patent: Nov. 26, 1985

[54] PULSE SIGNAL CONTROL CIRCUITS WITH IMPROVED TURN-OFF CHARACTERISTIC

[75] Inventors: Hiroshi Hada; Tsutomu Hirayama, both of Tokyo, Japan

[73] Assignee: NEC Corporation, Tokyo, Japan

[21] Appl. No.: 497,047

[22] Filed: May 23, 1983

[30] Foreign Application Priority Data

May 24, 1982 [JP] Japan ................... 57-87476

[51] Int. Cl.$^4$ ............................................. H03K 17/60
[52] U.S. Cl. ..................... 307/254; 307/270; 307/300; 307/231
[58] Field of Search ............... 307/254, 255, 280, 300, 307/540, 470

[56] References Cited

U.S. PATENT DOCUMENTS

| | | | |
|---|---|---|---|
| 3,183,370 | 5/1965 | Trampel | 307/300 |
| 3,363,116 | 1/1968 | Kan | 307/280 |
| 3,482,111 | 12/1969 | Gunderson et al. | 307/300 |
| 4,234,805 | 11/1980 | Carlsen, II | 307/254 |

Primary Examiner—Stanley D. Miller
Assistant Examiner—B. P. Davis
Attorney, Agent, or Firm—Burns, Doane, Swecker and Mathis

[57] ABSTRACT

A pulse signal transistor circuit with an improved turn-off characteristic comprises a first pulse signal source connected to the base electrode of the transistor and a second pulse signal source connected to the emitter electrode of the transistor. The first and second pulse signals have the opposite phases, thereby enhancing the extinction of minority carriers stored in the base region of the transistor.

6 Claims, 3 Drawing Figures

PULSE SIGNAL CONTROL CIRCUITS WITH IMPROVED TURN-OFF CHARACTERISTIC

BACKGROUND OF THE INVENTION

The present invention relates to a pulse signal control circuit and more particularly to a high frequency pulse signal control circuit for obtaining a high voltage pulse data signal containing a high frequency pulse train in response to a low voltage data signal.

An example of use for such pulse signal control circuit is a generator of high-voltage and high-frequency pulses for driving an alternating current (AC) drive type plasma display panels or the like.

In a driving circuit for an AC plasma display panel, it is desired to generate a high frequency pulse train with a good rise-time characteristic. Such driving circuit is disclosed in U.S. Pat. No. 4,359,648 issued on Nov. 16, 1982 to the same applicants of the present invention. This circuit comprises an amplifier circuit for amplifying a pulse data input signal. The amplifier circuit includes, a switching transistor which comprises an NPN type transistor with its emitter electrode grounded and its collector electrode connected to a high voltage source (+Vo) via a resistor which acts as a collector resistor for the switching transistor. The amplifier circuit further includes a buffer transistor which comprises NPN type transistor with its collector electrode connected directly to the source (+Vo) whereas its base electrode is connected to the juncture of the collector resistor with the collector electrode of the switching transistor. A buffer diode is connected across the base and emitter electrodes of the buffer transistor. In order to improve a rise-time characteristic of a high frequency pulse train at an output terminal connected to the emitter electrode of the buffer transistor, according to the above mentioned U.S. Patent, a preamplified high frequency pulse is normally applied to the collector electrode of the switching transistor via a diode. The phase of the preamplified high frequency pulse train is opposite to that of input pulse train applied to the base electrode of the switching transistor. Such preamplified high frequency pulse train is obtained by amplifying a high frequency input pulse train which is to be supplied to the base electrode of the switching transistor via a gate circuit and an inverter circuit. According to the above described circuit, since the preamplified high frequency pulse train can be directly applied to the base electrode of the buffer transistor when the switching transistor is turned off, the rise-time characteristic of the output pulse train is greatly improved.

However, since a turn-off characteristic of the switching transistor is poor due to the minority carrier storage effect, a large current would flow at every initial moment of that an input pulse changes from a high to low levels at the base electrode of the switching transistor. Although the turn-off characteristic of the switching transistor can be improved by supplying an input pulse to the gate thereof via a so-called speed-up capacitor, such improved circuit is not preferable to reduce it into a monolithic integrated circuit owing to the fact that the capacitor requires a large area. Especially, for the AC plasma display panel to be driven in a scanning mode, a large number of scanning electrodes require the same number of driver circuits and thus the presence of a large number of speed-up capacitors is an obstacle to reduce it into a monolithic integrated circuit.

SUMMARY OF THE INVENTION

Accordingly, it is an object of the present invention to provide an improved pulse signal control circuit capable of reducing a power loss while improving a rise-time characteristic of the output pulse.

Another object of the present invention is to provide a bipolar switching transistor circuit having a good turn-off characteristic without resorting to a speed-up capacitor.

To accomplish above objects, according to the present invention, the emitter electrode of a switching transistor is supplied with a high frequency pulse which has a phase opposite to that of an input pulse applied to the base electrode of the switching transistor.

According to a preferred embodiment of the invention, there is provided a pulse signal switching circuit comprising a transistor, a load connected between the collector electrode of the transistor and a source of a reference potential, a source of a first pulse signal connected to the base electrode of the transistor, and a source of a second pulse signal having a phase opposite to that of the first pulse signal connected to the emitter electrode of the transistor. The second pulse signal enhances the elimination of minority carriers stored in the base region of the transistor and thus the turn-off characteristic of the transistor is greatly improved without resorting to a speed-up capacitor.

According to a further preferred embodiment of this invention, there is provided a signal control circuit comprising first and second transistors, a first diode connected between the emitter and base electrodes of the first transistor, the first diode having a polarity opposite to the diode characteristic between the emitter and base electrodes, a resistor having a high resistance connected between the collector and base electrodes of the first transistor, a source of a reference potential connected to the collector electrode of the first transistor, means for connecting the collector electrode of the second transistor to the base electrode of the first transistor and to a second diode, a source of a first high frequency pulse signal connected to the emitter electrode of the second transistor, a source of a second high frequency pulse signal connected to the collector electrode of the second transistor through the second diode, and a source of a pulse data signal containing a high frequency input pulse signal connected to the base electrode of the second transistor, said first and second high frequency pulse signals having the same phase and said third high frequency pulse signal having a phase opposite to that of said first and second high frequency pulse signals, thereby producing a pulse data output signal containing an amplified high frequency pulse signal corresponding to the pulse data input signal on the emitter electrode of the first transistor.

BRIEF DESCRIPTION OF THE DRAWINGS

FIG. 1 shows a preferred embodiment of a pulse signal control circuit according to the present invention, in which a data input signal shown in FIG. 2A is supplied to one input terminal 11 of an OR gate circuit 10 and a high frequency input pulse train as shown in FIG. 2B is applied to the other input terminal 12 so as to produce a pulse data input signal as shown in FIG. 2C on the output terminal 13 of the gate circuit 10. The output terminal 13 of the gate circuit 10 is connected to the base electrode of a switching transistor 20 via an inverter 30. A base resistor 41 is connected between the base and emitter electrodes of the switching transistor 20 and the emitter electrode thereof is connected to the input terminal 12 rather than the ground. The collector electrode of the switching transistor 20 is connected to a Vo source terminal 51 through a high resistance collector resistor 42 having a resistance of one mega-ohms (1 M$\Omega$), for example. The collector electrode of the switching transistor 20 is also connected to the base electrode of a buffer transistor 50, and across the base and emitter electrodes thereof is connected a first diode 61 having a polarity opposite to that of the diode characteristic of the emitter and base electrodes. The collector electrode of the buffer transistor 50 is connected directly to the source terminal 51 whereas the emitter electrode is connected to an output terminal 70 leading to the load. The cathode electrode of a second diode 62 is connected to the collector electrode of the switching transistor 20 whereas the anode electrode of the second diode 62 is connected to a terminal 82, which is supplied with a high frequency amplified pulse train shown in FIG. 2E. This high frequency amplified pulse train is formed by amplifying by a pulse amplifier 80 the input pulse train applied to the input terminal 12. The input pulse train may have a frequency of 200 to 500 kHz, for example, and which is amplified to the extent nearly equal to the voltage of the source.

Figure 1:
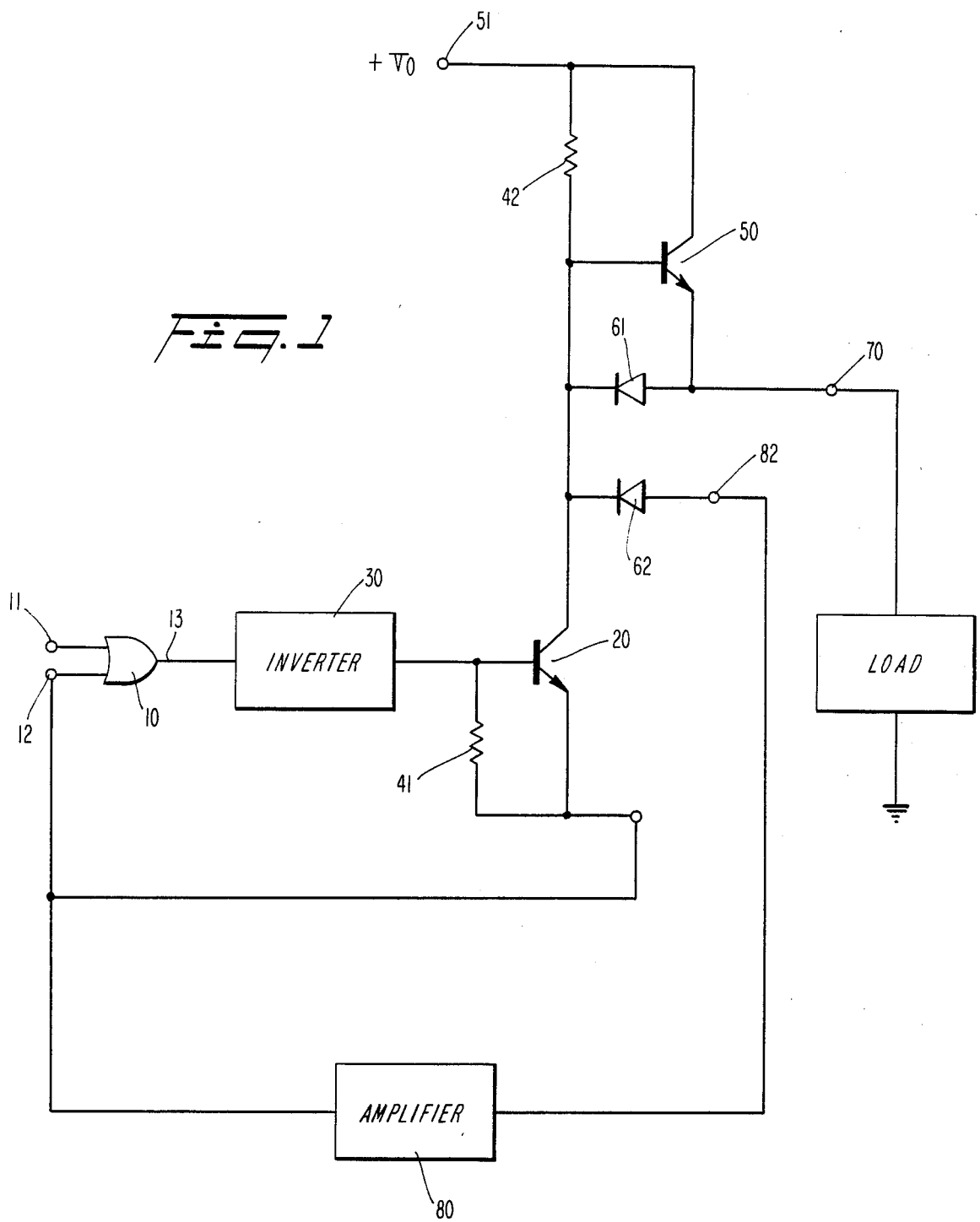
FIG. 1 is a circuit diagram showing a preferred embodiment of the pulse signal control circuit according to the present invention.

The operation of the circuit shown in FIG. 1 will now be described with reference to FIGS. 2A to 2F. It is now assumed that the high frequency input pulse train is supplied to both the input terminal 12 of the gate circuit 10 and the emitter electrode of the switching transistor 20, that a preamplified high frequency pulse train shown in FIG. 2E is supplied to the collector electrode of the switching transistor 20 via a terminal 82 and the second diode 62 and that a pulse data input signal shown in FIG. 2D is applied to the base electrode of the switching transistor 20 under these conditions.

Where no data input signal is contained in the pulse data input signal, that is where data is not applied to the input terminal 11 of the gate circuit 10, the output of the OR gate circuit is a high level. Accordingly, the output of inverter 30 is a low level and thus the switching transistor 20 is maintained non-conductive. Accordingly, the emitter electrode of the buffer transistor 50 is maintained at a source voltage +Vo or the positive crest value +V of the amplified pulse train which is applied to the base electrode of the buffer transistor 50 through the second diode 62. After that, even if the high frequency amplified pulse changes from the high to low level, the base electrode of the buffer transistor 50 is maintained at a high level with respect to voltage at the terminal 82. This is because the second diode 62 is poled oppositely and the other circuit connected to the base electrode of the switching transistor 20 is isolated from the base electrode of the buffer transistor 50. Accordingly, the buffer transistor 50 is maintained conductive until the next high level is supplied, whereby an output having a peak voltage of approximately +Vo is continuously supplied to the output terminal 70.

On the other hand, where the pulse data signal contains data, the switching transistor 20 is repeatedly turned on and off depending upon the polarity of the data pulse. Since the turn-on characteristic of the switching transistor 20 is good, the output terminal 70 can be rapidly fixed to the ground potential when the base level becomes high. Moreover, when the input level at the base of the switching transistor 20 is changed from high to low levels such as from +5 volts to zero volts, the emitter level is changed from low to high, and thus the minority storage carriers in the base region of the switching transistor 20 can be pulled out rapidly. Therefore the turn-off characteristic of the switching transistor 20 is greatly improved without resorting to a speed-up capacitor. At this time, in addition, since the high frequency amplified pulse train at the terminal 82 has a high voltage +V nearly equal to source voltage Vo such as 150 volts, the amplified voltate +V quickly appears at the output terminal 70. Thus, a high voltage output data pulse signal with an excellent rise-time characteristic is produced at the output terminal 70. The amplified voltage +V should be higher than what required to drive a device connected to the output terminal 70.

Figure 2A:
FIGS. 2A to 2F show waveforms useful to explain the operation of the pulse signal control circuit shown in FIG. 1.
Figure 2B:
Figure 2C:
Figure 2D:
Figure 2E:
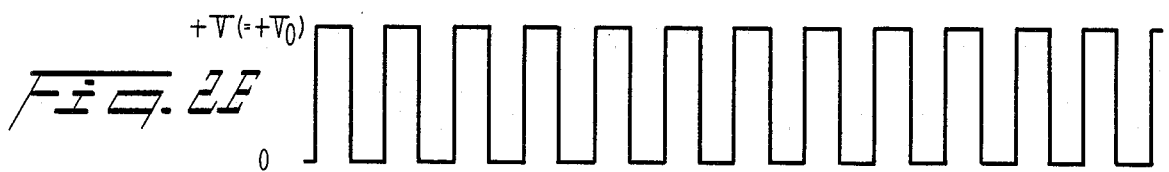
Figure 2F:
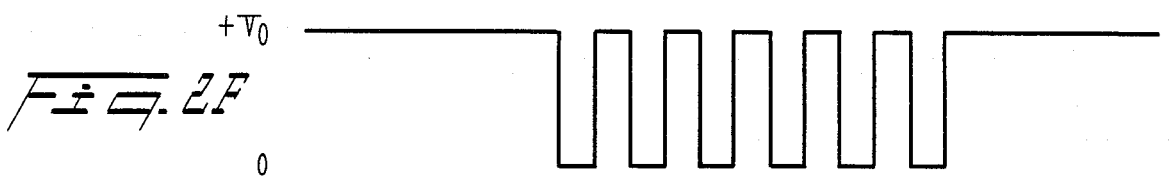

As shown in FIG. 2F, this high voltage output data pulse signal corresponds to an amplified waveform of the pulse data input signal shown in FIG. 2C.

As disclosed in the aforementioned U.S. Patent, even if the emitter electrode of the switching transistor 20 were grounded, since the rise-time of the output pulse is principally dominated by the characteristic of the amplifier 80 while the fall-time of the output pulse is done by the turn-on characteristic of the switching transistor 20, the output pulse having both the rise and fall times less than 0.2 $\mu$s will become available. However, according to the above described preferred embodiment of the present invention, the output pulse waveform is further improved such that the rise-time less than 0.1 $\mu$s will become available without resorting a speed-up capacitor. Moreover, since the collector resistor 42 is set to a high value, and since the turn-off characteristic of the switching transistor 20 is excellent, the power loss of the circuit can be greatly reduced. For example, when the above described pulse signal control circuit of the present invention is applied to each driving circuit for one hundred scanning electrodes of the AC plasma display panel which is operated at about 300 kHz to 400 kHz, the overall power consumption of the system is improved by as much as 10 to 20% compaired with the case of employing the emitter-grounded circuit disclosed in the aforementioned U.S. Patent.

Although in the foregoing embodiment, NPN type transistors 20 and 50 were used, they may be PNP type in which event the first and second diodes 61 and 62 are poled oppositely.

Figure 3:
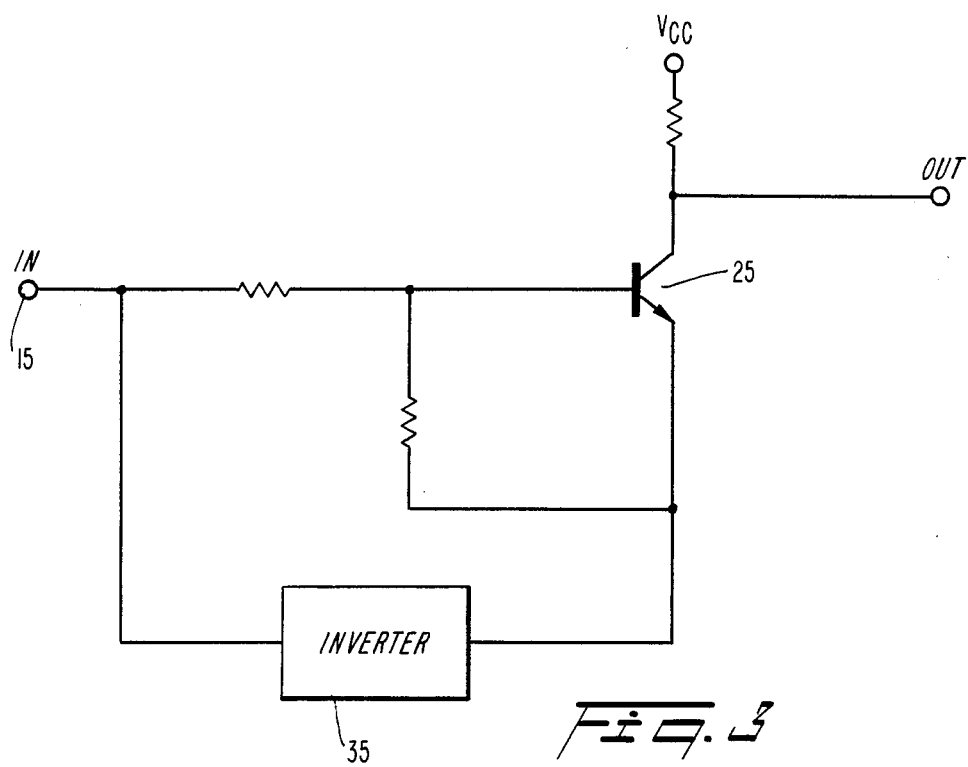
FIG. 3 is a circuit diagram showing a fundamental switching transistor circuit according to the present invention.

Furthermore, the concept of the present invention can be applied to any other transistor circuits relying on a speed-up capacitor. In FIG. 3, for example, the present invention is applied to a well known pulse amplifier circuit of saturation type. That is, the emitter electrode of a transistor 25 is connected to an input terminal 15 via an inverter 35 instead of connecting to the ground, and thereby improving a turn-off characteristic of the transistor 25 without resorting a speed-up capacitor.

As in the case of FIG. 3, the inverter 30 indicated in FIG. 1 may be connected to the emitter electrode of the switching transistor 20 and the amplifier 80 rather than to the base electrode of the switching transistor 20.

Such modified circuit is useful when many such circuits are arranged in an array structure as in the case of driver circuits for a plasma display panel, because only one inverter is required to provide a common high frequency input pulse train to all emitter electrodes of the switching transistors. In the same reason, only one amplifier is used commonly to supply a high frequency amplified pulse train to every collector electrodes of the switching transistors. Therefore an array structure of many driver circuits can be integrated in a small area. This is quite a contrast to the conventional drive circuit using a speed-up capacitor. Since the speed-up capacitor cannot be commonly used, an array structure of conventional drive circuits requires the same number of capacitors as the number of circuits, and thus making it difficult to reduce it into a monolithic integrated circuits.

What is claimed is:

1. A pulse signal control circuit comprising first and second transistors, a first diode connected between the emitter and base electrodes of said first transistor, said first diode having a polarity opposite to the diode characteristic between said emitter and base electrodes, a resistor having a high resistance connected between the collector and base electrodes of said first transistor, a source of a reference potential connected to the collector electrode of said first transistor, means for connecting the collector electrode of said second transistor to the base electrode of said first transistor and to a second diode, a source of a first high frequency pulse signal connected to the emitter electrode of said second transistor, a source of a second high frequency pulse signal having the same phase as said first high frequency pulse signal connected to the collector electrode of said second transistor through said second diode, and a source of a pulse data input signal containing a high frequency input pulse signal connected to the base electrode of said second transistor, the phase of said high frequency input pulse signal being opposite to that of said first and second high frequency pulse signals, thereby producing an amplified pulse data output signal corresponding to said pulse data input signal on the emitter of said first transistor, said pulse data output signal containing a high frequency signal.

2. A pulse signal control circuit according to claim 1 wherein said pulse data input signal source comprises a logic gate circuit having a first input terminal supplied with a data input signal and a second input terminal supplied with said first high frequency pulse signal, and means for inverting the output of said gate circuit to produce said pulse date input signal.

3. A pulse signal control circuit according to claim 2 wherein said second high frequency pulse signal supplied to the collector electrode of said second transistor is obtained by amplifying said first high frequency pulse signal supplied to said second input terminal of said logic gate circuit.

4. A pulse signal control circuit comprising first and second transistors, a first diode connected between the emitter and base electrodes of said first transistor, said first diode having a polarity opposite to the diode characteristic between said emitter and base electrodes, a resistor having a high resistance connected between the collector and base electrodes of said first transistor, a source of a reference potential connected to the collector electrode of said first transistor, means for connecting the collector electrode of said second transistor to the base electrode of said first transistor and to a second diode, a source of a high frequency pulse signal, means for inverting said high frequency pulse signal to produce a first high frequency pulse signal connected to the emitter electrode of said second transistor, a source of second high frequency pulse signal having the same phase as said first high frequency pulse signal connected to the collector electrode of said second transistor through said second diode, and a source of a pulse date input signal containing a high frequency input pulse signal connected to the base electrode of said second transistor, the phase of said high frequency input pulse signal being opposite to that of said first and second high frequency pulse signals, thereby producing an amplified pulse data output signal corresponding to said pulse data input signal on the emitter electrode of said first transistor.

5. A pulse signal control circuit according to claim 4 wherein said pulse data input signal source comprises a logic gate circuit having a first input terminal supplied with a data input signal and a second input terminal supplied with said high frequency pulse signal, thereby producing said pulse data input signal.

6. A pulse signal control circuit according to claim 5 wherein said second high frequency pulse signal is obtained by amplifying said first high frequency pulse signal.

* * * * *